US010854457B2

(12) United States Patent
Feigelson et al.

(10) Patent No.: US 10,854,457 B2
(45) Date of Patent: Dec. 1, 2020

(54) IMPLANTED DOPANT ACTIVATION FOR WIDE BANDGAP SEMICONDUCTOR ELECTRONICS

(71) Applicant: The Government of the United States of America, as represented by the Secretary of the Navy, Arlington, VA (US)

(72) Inventors: Boris N. Feigelson, Springfield, VA (US); Francis J. Kub, Arnold, MD (US); Alan G. Jacobs, Arlington, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 41 days.

(21) Appl. No.: 16/398,355

(22) Filed: Apr. 30, 2019

(65) Prior Publication Data

US 2019/0341261 A1    Nov. 7, 2019

Related U.S. Application Data

(60) Provisional application No. 62/666,718, filed on May 4, 2018.

(51) Int. Cl.
*H01L 21/268* (2006.01)
*H01L 21/04* (2006.01)
(Continued)

(52) U.S. Cl.
CPC ........ *H01L 21/268* (2013.01); *B23K 26/0006* (2013.01); *B23K 26/034* (2013.01);
(Continued)

(58) Field of Classification Search
CPC . H01L 21/268; H01L 21/041; H01L 29/2003; H01L 29/1602; H01L 29/1608;
(Continued)

(56) References Cited

U.S. PATENT DOCUMENTS 6,149,984 A     11/2000   Yamazaki et al.
6,657,154 B1 *  12/2003   Tanabe .................. B23K 26/06
                                                    219/121.6
(Continued)

FOREIGN PATENT DOCUMENTS

WO    2016126912 A1    8/2016
WO    2017136306 A1    8/2017

OTHER PUBLICATIONS

Search Report and Written Opinion dated Aug. 16, 2019 in corresponding International Application No. PCT/US2019/029774.

*Primary Examiner* — Kyoung Lee
(74) *Attorney, Agent, or Firm* — US Naval Research Laboratory; Joslyn J. Barritt

(57) ABSTRACT

An enhanced symmetric multicycle rapid thermal annealing process for removing defects and activating implanted dopant impurities in a III-nitride semiconductor sample. A sample is placed in an enclosure and heated to a temperature $T_1$ under an applied pressure $P_1$ for a time $t_1$. While the heating of the sample is maintained, the sample is subjected to a series of rapid laser irradiations under an applied pressure $P_2$ and a baseline temperature $T_2$. Each of the laser irradiations heats the sample to a temperature $T_{max}$ above its thermodynamic stability limit. After a predetermined number of temperature pulses or a predetermined period of time, the laser irradiations are stopped and the sample is brought to a temperature $T_3$ and held at $T_3$ for a time $t_3$ to complete the annealing.

25 Claims, 8 Drawing Sheets

(51) Int. Cl.
    *B23K 26/00*     (2014.01)
    *B23K 26/03*     (2006.01)
    *H01L 29/20*     (2006.01)
    *H01L 29/16*     (2006.01)
    *H01L 21/67*     (2006.01)
    *H01L 21/225*     (2006.01)
    *B23K 26/082*     (2014.01)
    *B23K 26/12*     (2014.01)
    *B23K 103/00*     (2006.01)
    *B23K 101/40*     (2006.01)

(52) U.S. Cl.
    CPC .......... *B23K 26/082* (2015.10); *B23K 26/127* (2013.01); *H01L 21/041* (2013.01); *H01L 21/0455* (2013.01); *H01L 21/2258* (2013.01); *H01L 21/67115* (2013.01); *H01L 29/1602* (2013.01); *H01L 29/1608* (2013.01); *H01L 29/2003* (2013.01); *B23K 2101/40* (2018.08); *B23K 2103/56* (2018.08)

(58) Field of Classification Search
    CPC ........... H01L 21/67115; H01L 21/2258; H01L 21/0455; H01L 21/26546; B23K 26/0006; B23K 26/034; B23K 26/082; B23K 26/127; B23K 2103/56; B23K 2101/40
    See application file for complete search history.

(56) References Cited

U.S. PATENT DOCUMENTS

| | | | |
|---|---|---|---|
| 7,351,646 B2 * | 4/2008 | Kusumoto | ........ H01L 21/02532 |
| | | | 438/166 |
| 8,518,808 B2 | 8/2013 | Feigelson et al. | |
| 9,543,168 B2 | 1/2017 | Feigelson et al. | |
| 2006/0260545 A1 | 11/2006 | Ramaswamy et al. | |
| 2018/0122630 A1 | 5/2018 | Leschkies et al. | |

* cited by examiner

IMPLANTED DOPANT ACTIVATION FOR WIDE BANDGAP SEMICONDUCTOR ELECTRONICS

CROSS-REFERENCE

This Application is a Nonprovisional of and claims the benefit of priority under 35 U.S.C. § 119 based on U.S. Provisional Application No. 62/666,718 filed on May 4, 2018. The Provisional Application and all references cited herein are hereby incorporated by reference into the present disclosure in their entirety.

TECHNICAL FIELD

The present disclosure relates to semiconductor processing, in particular to annealing of semiconductor materials to anneal the materials and to activate dopants therein.

BACKGROUND

Thermal annealing of defects in semiconductors occurs by the diffusion of atoms within a solid material, so that the material progresses towards its equilibrium state.

GaN and other III-nitrides and their alloys are a promising class of materials with favorable properties that have a broad range of technological applications. For example, the tunable direct bandgap between 0.7 and 6.1 eV make this class of materials attractive for photovoltaic, high power and optoelectronic applications. The wide bandgap and mobilities achievable make III-nitrides suitable for power electronic applications while the radiation hardness of III-nitrides makes them suitable for extreme environments required in military and space environments.

Despite having many promising characteristics, one of the major challenges for processing III-nitride materials, SiC and diamond is the ability to anneal at high temperatures. Annealing at high temperatures is a necessary step in semiconductor processing to repair implantation damage, activate implanted dopants, and repair damage induced by etching or other processing such as plasma processing or exposure to high temperatures as in the case of GaN. The ability to repair implantation damage and activate implanted dopants is imperative for precise control of the dopant profiles. Applications where this ability will be a key enabling step in selective area doping include implanted guard rings, which can be used for electric field spreading in vertical GaN diodes and implantation/activation of dopants which can be utilized in contact regions to lower contact resistance.

It is difficult to anneal defects in III-nitride semiconductors such as GaN and its alloys with InN and AlN and to activate dopant impurities after epitaxial growth of the semiconductor on a substrate, and especially after implantation of the dopant ions. Temperatures required for the removal of defects induced by ion implantation and activating dopant impurities such as magnesium (Mg) after their implantation are in the range of 1400° C. GaN is not stable at temperatures above 850° C. under atmospheric pressure, decomposing into Ga and $N_2$.

There are known approaches which partially solve the problem of GaN annealing. Pressure can be applied to permit GaN to remain stable for annealing at temperatures above 1400° C., but these pressures are above 1.0 GPa. Such high gas pressures require special equipment and make annealing procedure inefficient for the industrial use.

In other approaches, GaN can be annealed at temperatures higher than 850° C. if it is capped with materials which are more stable at high temperatures, for example, AlN. AlN cap is made by AlN sputtering or by AlN MOCVD growth on the top of GaN. The cap suppresses an escape of the nitrogen from GaN before built up pressure of nitrogen at the interface between GaN and AlN makes small cracks in the AlN film or breaks it. Use of AlN cap allows annealing of GaN at temperatures above 1000° C. without noticeable nitrogen loss from GaN.

Another approach allowing to enhance GaN annealing, is rapid thermal annealing (RTA).

Fast heating (in seconds) to the temperatures above 850° C. and cooling (in seconds) kinetically prevents GaN from the decomposition at temperatures above its thermodynamic stability (metastable regime). If high temperature is applied, for example, to GaN for a very short time, it allows one to partially anneal defects in GaN and keep GaN from decomposing. The higher temperatures are applied, the more species of defects are annealed. The higher temperature is applied, the shorter time should be applied to prevent GaN from the decomposing. During the fast heating, only nitrogen from the surface has time to leave GaN. If RTA is combined with the cap, it is possible to heat GaN very fast up to 1400° C. without noticeable decomposition. RTA with AlN cap allowed observation of a restoration of the GaN structure damaged by implantation and also obtain an activation of n-type impurities.

However, this type of annealing hasn't created p-type conductivity in the GaN samples implanted with Mg. One of the reasons for insufficient Mg activation in GaN is the very short time during which GaN is exposed to the high temperature during an RTA. Another reason is the damage to the GaN lattice induced by implantation of ions into the lattice, which makes the doped GaN less stable. Consequently, during non-equilibrium RTA of GaN, Mg may occupy too many available N-lattice sites and doesn't become a p-type impurity.

To overcome the disadvantages of the known annealing approaches for GaN and other III-nitride semiconductors, a new process named multicycle rapid thermal annealing (MRTA) was developed which combines using a cap, applying moderate $N_2$ overpressure, and applying multiple fast heating and cooling temperature pulses to accumulate long enough time at high temperatures for the required diffusion processes. See U.S. Pat. No. 8,518,808 to Feigelson et al., entitled "Defects annealing and impurities activation in III-nitride compound."

The efficiency of MRTA for diffusion-controlled defect annealing at temperatures above thermodynamic stability of materials was demonstrated by the electrical activation of Mg implanted in GaN showing for the first time p-type conductivity in Mg implanted GaN.

However, electrical conductivity along the surface of GaN after MRTA is not uniform. One of the reasons of such non-uniformity is slight degradation of the GaN crystalline quality caused by the fast heating and cooling cycles of MRTA process itself. These detrimental structural changes can be attributed to the formation of defects formed and quenched during rapid heating and cooling cycles.

A new technique, known as symmetric multicycle rapid thermal annealing (SMRTA), was developed to improve MRTA. See U.S. Pat. No. 9,543,168 to Feigelson et al., "Defects annealing and impurities activation in semiconductors at thermodynamically non-stable conditions." SMRTA includes the first step of a steady annealing regime at temperatures when the III-nitride is still stable, then the second step of the transient annealing at metastable regime using multiple fast heating temperature pulses with peak temperature above thermodynamic stability of III-nitride, and the third step of a steady annealing regime at temperatures when III-nitride is still stable. SMRTA made possible to produce GaN p-i-n diode using Mg implantation.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an enhanced symmetric multicycle rapid thermal annealing process (e-SMRTA) for removing defects and activating implanted dopant impurities in a III-nitride semiconductor sample.

The e-SMRTA process in accordance with the present invention includes a first steady annealing under an applied pressure $P_1$ and at a temperature $T_1$ where the III-nitride material is still stable at the applied pressure, similar to the standard SMRTA process. In most embodiments, RF inductive heating will provide heating for this step, though other heating methods may also be used as appropriate. The material is annealed at this temperature $T_1$ for a predetermined time $t_1$ to provide an initial removal of defects and activation of dopant impurities in the material.

The e-SMRTA process in accordance with the present invention also includes a second, transient annealing step at metastable conditions. In this second annealing step, following the first, steady-state annealing at temperature $T_1$, the material is maintained at a second steady state temperature $T_2$ at an applied pressure $P_2$ while a plurality of fast heating pulses, each having a pulse duration $t_p$ and a time between pulses $t_r$, are applied to the material to produce a plurality of rapid heating/cooling cycles where at each pulse, the area of the material targeted by the laser is rapidly heated up to a temperature $T_{max}$ which is above the temperature $T_s$, the maximum temperature at which the semiconductor is still thermodynamically stable (i.e., is heated to a temperature at which the material is ordinarily thermodynamically unstable), cools to a temperature below $T_s$ and then is rapidly heated again with the next pulse. $T_2$ can be any temperature below $T_s$, though typically will be near $T_s$.

The rapid heating and cooling of the sample in the e-SMRTA method in accordance with the present invention is produced by laser irradiation, which allows for very rapid heating and cooling since the heat generated by the laser is localized near the surface and is rapidly dissipated into the bulk of the material.

The laser irradiation can be in the form of either pulsed laser irradiation or scanned continuous wave (CW) laser irradiation, where the heating is produced by a single laser irradiation (pulsed or scanned CW) which is repeated to produce a plurality of heating pulses applied to the material.

For pulsed laser irradiation, moderately large areas may be exposed for a single or multitude of pulses, with adjacent areas irradiated sequentially allowing a very large area to be stitched together with the same or different irradiation parameters (e.g., heating duration, pulse energy, number of pulses, and/or time between pulses). For pulsed laser irradiation, the heating duration or heat pulse duration is some fraction or multiple of the laser irradiation pulse duration as measured for specific process parameters.

For scanned continuous wave laser irradiation, the CW laser is focused to a small spot and scanned across the sample heating a line with finite width. Subsequent passes on the same or adjacent areas allow areas to be irradiated with different parameters (e.g., heating duration, laser power, number of scans, overlap of scans, and/or time between scans). For scanned CW laser irradiation, the heating duration or heat pulse duration is some fraction or multiple of the laser beam focus in the scan direction divided by the laser scan velocity (i.e. the dwell time) as measured for specific process parameters.

Finally, the e-SMRTA process in accordance with the present invention, following the second annealing step, the material is brought to a third temperature $T_3$ at which the material is stable under an applied pressure $P_3$ and is kept at temperature $T_3$ for a predetermined period of time $t_3$ in a third steady annealing regime to further remove defects and activate the dopant impurities in the material.

DETAILED DESCRIPTION

Figure 1:
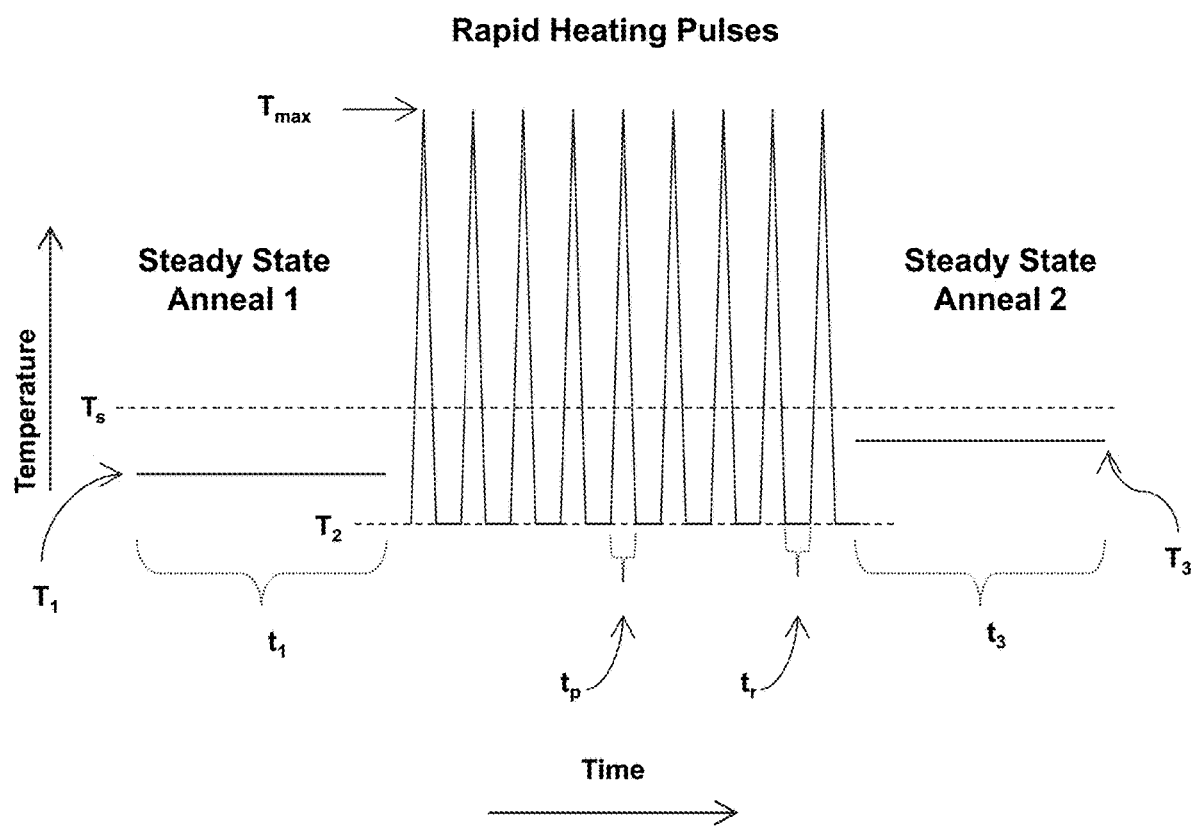
FIG. 1 is a block schematic providing an overview of aspects of an exemplary three-stage e-SMRTA annealing process in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for annealing defects and activating impurities in such semiconductors.

The present invention also provides a method for annealing defects and activating implanted dopants in semiconductors.

The present invention provides a method for annealing semiconductor materials such as GaN, InN, AlN, BN, and their alloys, as well as SiC and diamond, which become thermodynamically unstable at the high temperatures required for defects annealing of that material. Annealing of defects in semiconductor materials typically requires a homologous temperature of about 0.7 times the material's melting temperature $T_m$. While this 70% value is not absolute, it gives a general temperature about which atomic motion tends to occur in the solid and significant annealing can be achieved. For example, GaN melts at ~2200° C. (~2473 K), while defects in GaN anneal at about of 0.7*2473 K=1731 K or ~1458° C. However, as noted above, at atmospheric pressure, GaN becomes unstable at temperatures over 850° C., decomposing into Ga and $N_2$. The present invention provides a method to overcome this instability and keep the material metastable so that it can be annealed.

The present invention also provides a method for annealing defects in III-nitride semiconductors after dopant ion implantation and activating the implanted dopant impurities in the material.

The present invention also provides a process which provides the necessary conditions and parameters for annealing implant-induced damage and activating the implanted dopant impurities in III-nitride semiconductors.

The present invention also provides various embodiments of an apparatus which provides the necessary conditions and parameters for annealing implant-induced damage and activating the implanted dopant impurities in III-nitride semiconductors.

The present invention also provides various embodiments of an apparatus which provides the necessary conditions and annealing parameters for activating implanted Mg and other dopants in GaN.

The present invention can be used to form p-type semiconductor regions in III-nitride semiconductors which are doped during material growth, by ion implantation after growth, or by both methods.

The present invention also can be used to form n-type semiconductor regions in III-nitride semiconductors which are doped during material growth, by ion implantation after growth, or by both methods.

The present invention also can be used to form p-n junctions in semiconductor regions in III-nitride semiconductors which are doped during material growth, by ion implantation after growth, or by both methods.

The present invention also can be used to make electronic and optoelectronic devices from III-nitride semiconductors, where the devices require p-type regions, n-type regions, and/or both types of regions in the semiconductor materials.

The present invention also can be used to make electronic and optoelectronic devices from III-nitride semiconductors, where the devices require p-n type semiconductor regions in the semiconductor materials.

These and other aspects of this invention can be accomplished by the new process of thermal annealing and new annealing apparatus described below.

In accordance with the present invention the new thermal annealing process includes the elements of the known SMRTA process described in U.S. Pat. No. 9,543,168 cited above, plus additional elements to produce a new annealing process that improves efficiency of activation and makes it possible, for example, to dope GaN by implantation in selective areas and create uniform p-type conductivity in the Mg-implanted parts of a GaN sample.

This new process can be described as an enhanced SMRTA (e-SMRTA) process.

The e-SMRTA process in accordance with the present invention uses a new dual heating annealing system which includes radiofrequency (RF) and laser heating working independently together inside a chamber or enclosure having a controlled gas atmosphere at pressures above 1 bar.

The block schematic in FIG. 1 provides an overview of the e-SMRTA annealing process in accordance with the present invention.

As shown in FIG. 1 and as described in more detail below, the e-SMRTA process in accordance with the present invention includes a first steady annealing under an applied pressure $P_1$ and at a temperature $T_1$ where the III-nitride material is still stable at the applied pressure, similar to the standard SMRTA process. In most embodiments, RF inductive heating will provide heating for this step, though other heating methods may also be used as appropriate. The material is annealed at this temperature $T_1$ for a predetermined time $t_1$ to provide an initial removal of defects and activation of dopant impurities in the material.

The e-SMRTA process in accordance with the present invention also includes a second, transient annealing step at metastable conditions. In this second annealing step, following the first, steady-state annealing at temperature $T_1$, the material is maintained at a second steady state temperature $T_2$ at an applied pressure $P_2$ while a plurality of fast heating pulses, each having a pulse duration $t_p$ and a time between pulses $t_r$, are applied to the material to produce a plurality of rapid heating/cooling cycles where the material at each pulse is rapidly heated up to a temperature $T_{max}$ which is above the temperature $T_s$ at which the semiconductor is thermodynamically stable, cools to a temperature below $T_s$ and then is rapidly heated again for the next temperature pulse. In most cases, the rapid heating is produced by a singular laser pulse or scan with several sequential pulses or scans producing a plurality of temperature pulses as needed by process considerations.

Finally, the e-SMRTA process in accordance with the present invention, following the second annealing step, the material is brought to a third temperature $T_3$ at which the material is stable under an applied pressure $P_3$ and is kept at temperature $T_3$ for a predetermined period of time $t_3$ in a third steady annealing regime to further remove defects and activate the dopant impurities in the material.

Figure 2:
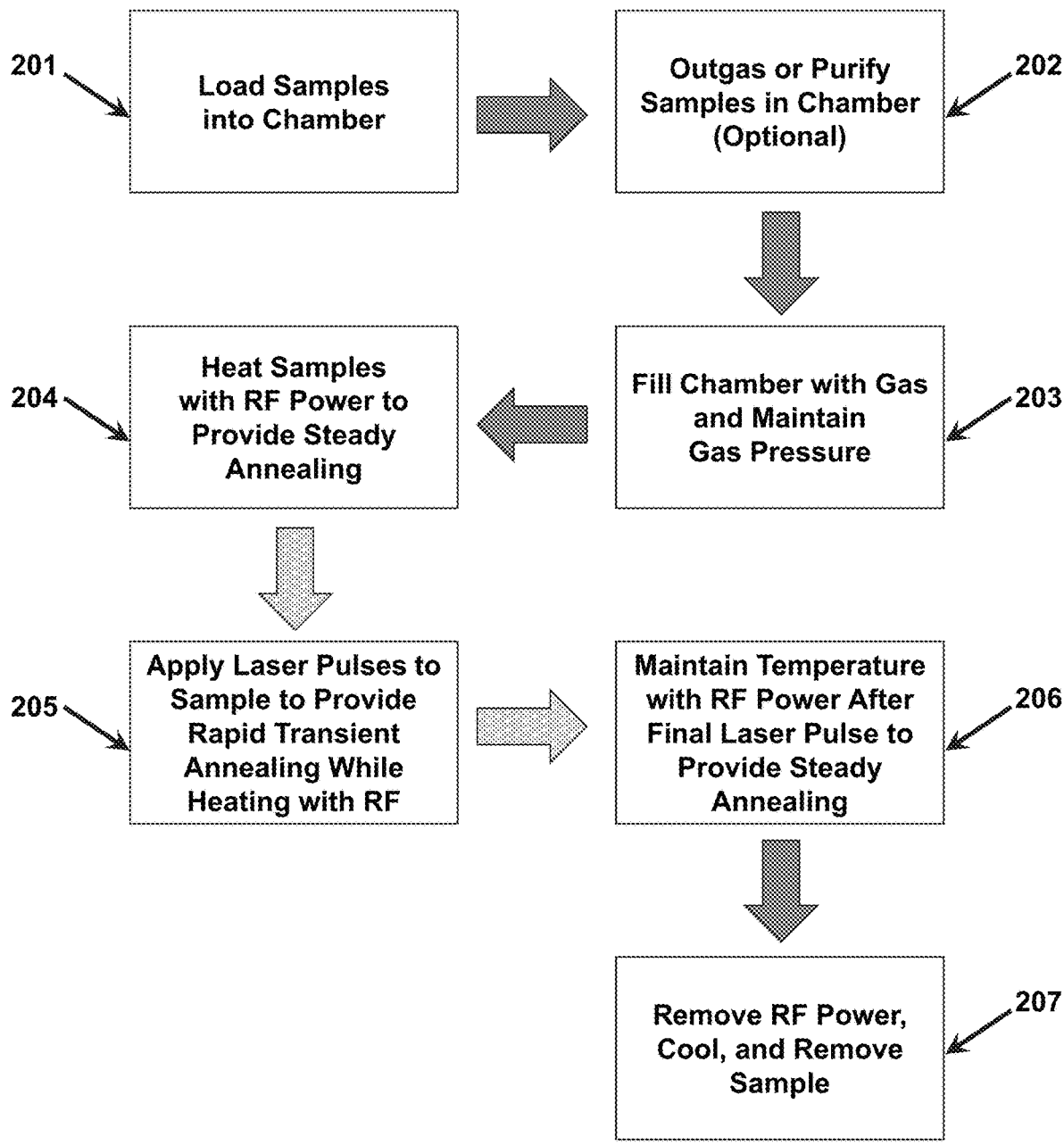
FIG. 2 is a flow chart illustrating aspects of an exemplary process flow in a method for implanted dopant activation in a III-nitride semiconductor material in accordance with the present invention e.

The exemplary process flow illustrated in FIG. 2 provides further detail regarding the e-SMRTA method for annealing defects and activating implanted dopant impurities in a III-nitride semiconductor in accordance with the present invention.

As shown in FIG. 2, in a first step 201, one or more samples to be processed are loaded into a chamber or other suitable enclosure. The samples can include III-nitride semiconductors such as GaN, InN, AlN, BN, or alloys thereof that have dopants such as magnesium, silicon, carbon, boron, beryllium, oxygen, aluminum, phosphorus, or iron introduced thereinto, either during their epitaxial growth, by ion implantation following their growth, or by both methods. In some embodiments, the samples can include any one or more of III-nitride bulk materials such as GaN or other semiconductor materials such as Si, SiC, diamond, or sapphire. In some embodiments, the sample can include a film deposited on a substrate, such as a GaN film deposited on a sapphire, Si, or SiC substrate or can include multiple films deposited on the substrate, such as an AlN film deposited on an AlN film which in turn is deposited on a GaN layer deposited on a SiC substrate. In some embodiments, the sample can include a laser beam susceptor, i.e., a material that can be heated by absorbing a laser light, deposited on the target film, e.g., a layer of tungsten (W) deposited on an AlN film deposited on a GaN layer deposited on a SiC substrate.

In an optional step, shown as step 202 in FIG. 2, the samples in the chamber are outgassed and/or purified. This step can be accomplished by any suitable means such as by applying a vacuum to the vessel to remove excess gases and/or by heating the vessel to remove excess water from the interior of the chamber that might contaminate the sample or otherwise interfere with subsequent processing steps.

In a third step 203, the chamber is filled with a gas and is pressurized to a predetermined gas pressure $P_1$, where the gas and the pressure are determined by the material to be treated.

Typical gases that can be used will most often include nitrogen or argon, but ammonia, hydrogen, or controlled amounts of water vapor or other gas species such as helium, nitrogen, neon, argon, krypton, or xenon may also be included in the gas as appropriate. For example, in some embodiments annealing GaN, nitrogen at pressures of about 25 to 100 bar is used, with the pressure depending on the substrate, since different substrates require different gas pressures to maintain or extend stability. However, the stability of the material can be affected by small amounts of other gases. For example, while a small amount of ammonia in the nitrogen gas stabilizes the Ga-polar face of GaN, it will destabilize the N-polar face, causing the GaN to lose nitrogen, so ammonia should be avoided when processing N-polar GaN. On the other hand, SiC tends to lose silicon at high temperatures, leaving carbon (or graphene) on the surface, and so when processing SiC in accordance with the present invention, a gas that includes a source of silicon may be preferred.

In some embodiments, the gas in the chamber will be pressurized to a pressure P1 greater than 10 atm (1 MPa) but pressures in the range of 1 to 1000 atm (0.1 to 100 MPa) may be applied as appropriate. In other embodiments, the pressure in the vessel can be reduced from atmospheric pressure to lower pressures, e.g., to a pressure of 1 Pa to 0.1 MPa, using a vacuum pump.

Once the gas in the vessel reaches the predetermined pressure, at step 204 shown in FIG. 2, in a first annealing step in the e-SMRTA process in accordance with the present invention, the sample is heated to the predetermined temperature $T_1$ just below the temperature $T_s$, above which the material to be treated becomes thermodynamically unstable, to provide a steady first annealing of the sample. The steady heating in this step typically can be accomplished by applying RF heating to the sample, but any other suitable means such as resistive heating that can apply long-term steady heat to the sample can also be used.

The temperature $T_1$ to which the sample is heated typically will depend on the material to be treated, the pressure applied in the chamber, and the degree of defects to be removed at this first steady annealing step. For example, as noted above, at atmospheric pressure, GaN becomes unstable and undergoes decomposition to Ga and $N_2$ at about 850° C. Providing pressure above 1 atm in the chamber will allow the GaN to be subjected to temperatures above 850° C. without negatively affecting its stability. Thus, in the case of GaN annealing, if the chamber is under a nitrogen pressure of 1 atm, heating the sample to about 800° C. will provide a certain reduction in defects while increasing the nitrogen pressure in the chamber up to 40 atm allows to heat GaN to temperature of 1000° C. without it decomposing so that more defects can be removed.

The sample is maintained at temperature $T_1$ for a predetermined time $t_1$, where $t_1$ can range from one minute up to one day, depending on the material to be treated, the extent of defect removal/dopant activation to be accomplished at this stage, and the processing conditions.

The purpose of this first annealing step is to reduce the first portion of the defect population and to improve the stability of the material during the subsequent high temperature pulses. It will perform some defect reduction from very high concentrations and also reduce stress and generally improve the material quality to the maximum extent possible while keeping the material thermodynamically stable. Thus, the purpose of this first anneal is to reduce the concentration of these defects to the greatest degree possible before applying the high temperature pulses to the material.

After the sample has been heated to $T_1$ with the RF power to provide steady annealing of the sample for a first predetermined period of time $t_1$, in the second e-SMRTA annealing step 205 in accordance with the present invention, while the chamber is pressurized to a second predetermined pressure $P_2$ (which can be the same or different from pressure $P_1$), the sample is subjected to a plurality of laser pulses or scans directed into the sample to provide cyclic rapid heating and cooling to further remove defects and activate dopants in the sample. Using fast laser pulses or scans in accordance with the present invention allows the material to undergo a heating-cooling cycle duration in the nanosecond to many millisecond range.

The RF (or other) heating is maintained to heat the sample to a baseline temperature of $T=T_2$ which is maintained while these laser pulses or scans are applied. Thus, in accordance with the present invention, in the second step in the e-SMRTA method of the present invention, a series of laser pulses or scans are applied to rapidly heat the sample from temperature $T_2$ to a predetermined temperature $T_{max}$, where $T_{max}$ is higher than a temperature $T_s$, a threshold temperature at which the material is still stable at the applied pressure $P_2$. One skilled in the art will readily understand that temperature $T_{max}$ is very material dependent. For example, in the case of GaN, $T_{max}$ may be in the range of 1300-1700° C. (likely 1400-1550° C. or so) but could be in excess of that. In contrast, for InN (and alloys that include InN), $T_{max}$ will be much lower since InN starts to decompose at temperatures of about 550° C. For SiC, silicon loss occurs above 1400° C. but it is grown at 1600° C., and so temperatures above that would be necessary, most likely about 1800-2200° C.

The temperature pulses are applied at a predetermined rate with a predetermined rest time $t_r$ between pulses, with each heating and cooling cycle in which the temperature of the impinged sample ranges between $T_2$ and $T_{max}$ occurring for a cycle time $t_p$. After the sample is heated to temperature $T_{max}$, the sample then rapidly cools to temperature $T_2$ for the time $t_r$ between pulses and then is again rapidly heated to temperature $T_{max}$ upon the application of the next pulse. During each heating and cooling cycle, the sample is exposed to temperatures above $T_s$ for less time than a time $t_d$ at which the sample would start to decompose at temperatures between $T_s$ and $T_{max}$, but as a result of the application of multiple such heating and cooling cycles, the sample can be exposed to temperatures above $T_s$ for a total cumulative time $t_{sum}$ greater than $t_d$ without the sample decomposing.

The duration $t_p$ of each heating cycle can range from nanoseconds to seconds, depending on the processing conditions, the material to be treated, and the desired extent of defects removal/dopant activation to be attained. For example, scanned laser systems (e.g. $CO_2$ laser systems) can achieve ~10 microsecond and longer temperature pulses fairly easily, while pulsed lasers (e.g. excimer lasers) can readily apply temperature pulses lasting 10 s of nanoseconds. One skilled in the art will readily recognize that any suitable laser such as diode lasers, solid-state lasers, frequency-multiplexed lasers, dye lasers, q-switched lasers, or chirped lasers can be used to apply the laser pulses or scans in the e-SMRTA method of the present invention.

The shortest heating and cooling cycle duration provided by the RF heating step in the standard SMRTA process described in U.S. Pat. No. 9,543,168, supra, is limited to the scale of seconds. Application of faster heating and cooling rates using a laser in the e-SMRTA process in accordance with the present invention allows even higher maximum peak temperatures to be applied to the semiconductor material without the material decomposing. In return, the higher peak temperature at each of the multiple heating pulses provides better conditions for diffusional processes in a semiconductor material, and result in better restoration of structure damaged by implantation and better activation of the implanted dopants while preserving the integrity of the semiconductor.

Thus, in accordance with the present invention, the RF (or other) heating of the vessel is maintained simultaneously with the laser heating of the sample in the second annealing step. The laser heating of the sample allows for defect removal at very high peak temperatures with extremely fast heating-cooling cycles, while the applied RF heating keeps the whole sample at the necessary baseline temperature, i.e., at or below the thermodynamic stability limit of the material at the applied pressure, throughout the laser heating regime.

The laser pulses or scans are applied either for a predetermined number of temperature pulses or for a predetermined period of time $t_2$, with the number of pulses and/or the period of time being determined by the processing conditions, the material to be treated, and/or the extent of defects to be removed/dopant activation to be achieved. The laser energy deposited into the sample at each pulse or scan can be modulated either by modifying the laser source power input to the optical systems or by maintaining constant output which is modulated by attenuating optics.

By using laser heating during the second annealing step in accordance with the present invention, large areas of the whole area of semiconductor can be treated by rastering the laser beam across the sample. In other cases, the laser can be applied selectively to one or more areas of the sample at the same or at different laser powers. In such cases, the laser beam can be directed toward and rastered across the first area $A_1$ at power $P_{W1}$, causing a predetermined number of heating pulses that obtain a predetermined maximum temperature $T_{max1}$, and then can be directed toward another area $A_2$ at power $P_{W2}$ causing several heating pulses to a maximum temperature $T_{max2}$ to obtain different degrees of dopant activation in different areas of the sample.

At the end of the predetermined time/number of heating pulse cycles, in a next step 206, the laser is turned off, but the RF heating is maintained at temperature $T_3$ under an applied pressure $P_3$, where one or the other of temperature $T_3$ and $P_3$ can be the same or different from the original temperature $T_1$ or pressure $P_1$ for a third annealing step in which the material is annealed for a predetermined time $t_3$ in a steady annealing regime at temperatures at which a semiconductor is still stable at pressure $P_3$. The time $t_3$ at which the material is held at temperature $T_3$ for this third annealing step can range from one minute to one day, depending on the processing conditions, material to be treated, and/or the extent of defects to be removed/dopant activation to be achieved. Finally, in step 207, the RF power is removed and sample is cooled and removed from the vessel.

Thus, the new dual heating annealing system, which includes RF and laser heating working independently together inside a chamber with controlled gas atmosphere at pressures above 1 bar, provides an enhanced symmetric multicycle rapid thermal annealing process by heating a semiconductor sample in a vessel to a predetermined baseline temperature, applying a plurality of nano- to millisecond heating/cooling cycles allowing maximum peak temperatures higher than standard SMRTA processing, and then maintaining the elevated temperature after the end of the laser heating cycle while keeping the integrity of the semiconductor material in the treated sample.

Where and the extent to which the laser power is absorbed can depend on the type of laser used and its power, as well as on the characteristics of the sample to which the laser pulse or scan is applied. As a result, the laser power can be absorbed in the substrate, or in one or more of the films deposited on the substrate, or in the laser susceptor layer where one is present.

Figure 3A:
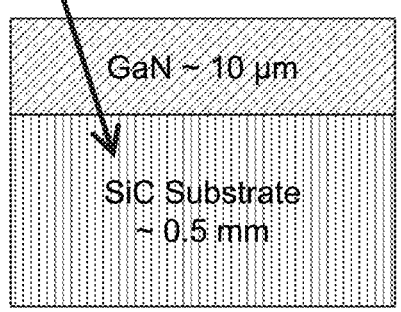
FIGS. 3A-3D are block schematics illustrating various exemplary embodiments of ways in which III-nitride samples can absorb the power from a laser pulse or scan applied to the sample in accordance with one or more aspects of the present disclosure.
Figure 3B:
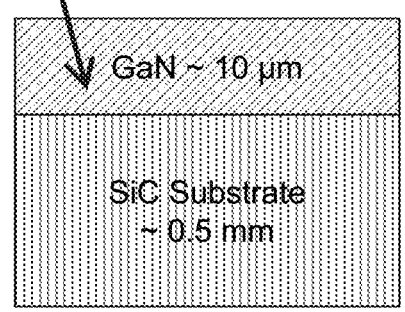
Figure 3C:
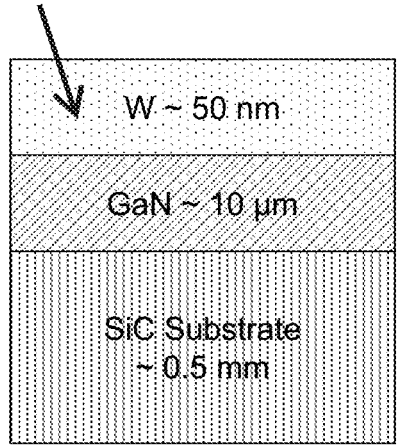
Figure 3D:
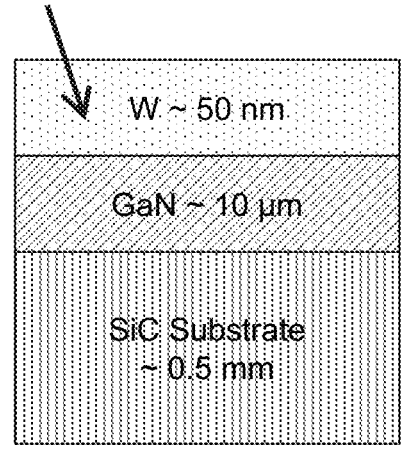

The block schematics in FIGS. 3A-3D illustrate the way in which the laser power can be absorbed by samples of differing characteristics. As illustrated by the block schematic in FIG. 3A, a 10.6 μm $CO_2$ laser directed at a GaN film deposited on a conductive SiC substrate passes through the GaN film and is absorbed by the substrate, whereas as illustrated in FIG. 3B, a 308 nm XeCl excimer laser directed at a similar GaN film deposited on a bulk SiC substrate is absorbed by the GaN. In contrast, as illustrated in FIGS. 3C and 3D, in the case of a sample having a laser susceptor layer such as the 50 nm tungsten (W) layer shown in FIGS. 2C and 2D deposited on the III-nitride layer, pulses or scans from both a 10.6 μm $CO_2$ laser and a 308 nm XeCl excimer laser directed at a similar GaN film are absorbed by the W susceptor layer. In all cases, as described above, at each applied laser pulse or scan, energy from the laser raises the temperature of the III-nitride material to a temperature $T_{max}$ above a temperature $T_s$ at which the material is thermodynamically stable for a period of time $t_p$, typically from 10s of nanoseconds to milliseconds, with the material being annealed by exposure to this high temperature for a cumulative period of time that is longer than the material would ordinarily be stable at temperatures above $T_s$.

The block schematics in FIGS. 4-7 illustrate aspects of various embodiments of an apparatus that can be used to remove defects and activate dopants in a sample using the dual RF/laser annealing method described above.

Figure 4:
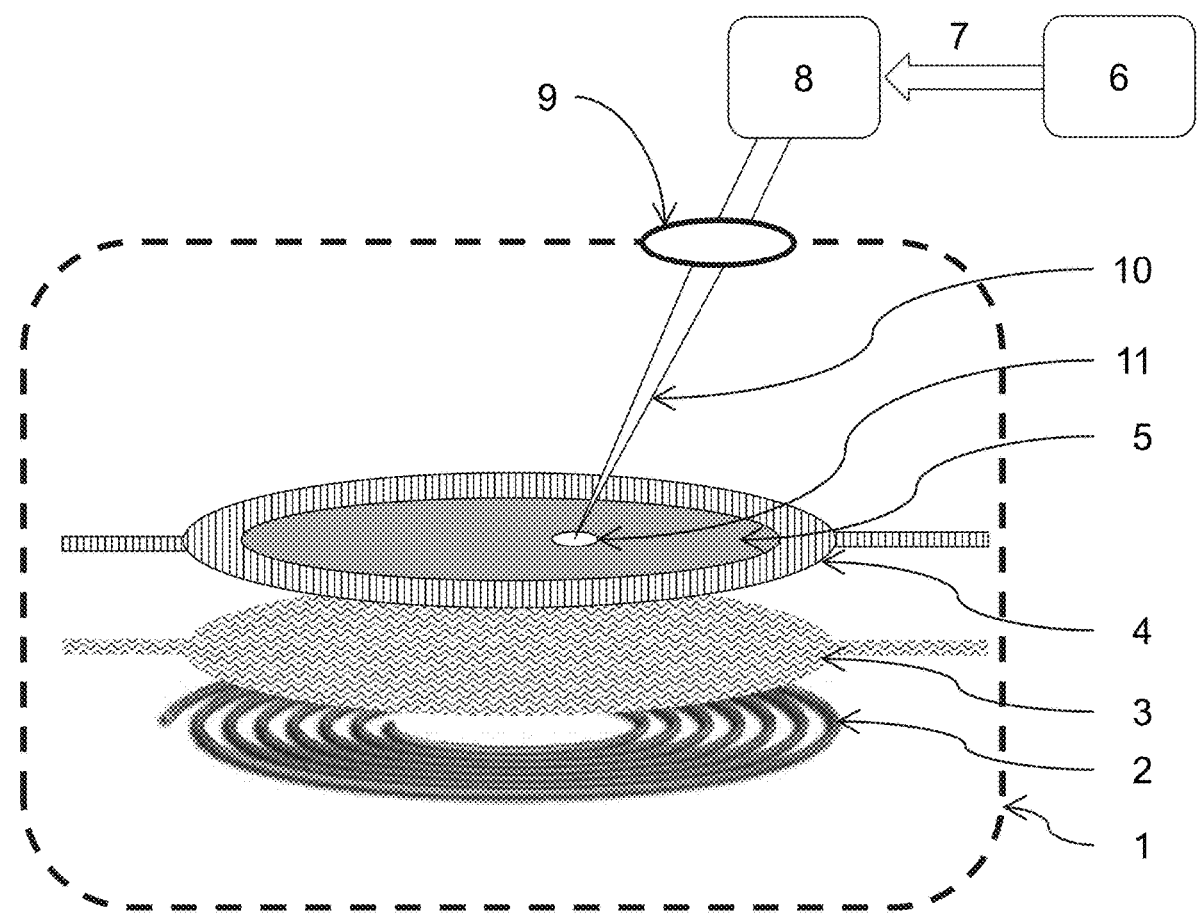
FIG. 4 is a block schematic illustrating aspects of an exemplary apparatus for use in activating implanted dopants in a III-nitride semiconductor material in accordance with the present invention.

FIG. 4 illustrates a first exemplary embodiment of such an apparatus. As shown in FIG. 4, in this embodiment, the apparatus includes a chamber 1 containing RF coil 2 and RF susceptor 3 on an upper surface of RF coil 2 and further containing a sample holder/crucible 4 made of an inert material, such as boron nitride, which is configured to hold a sample 5. In the embodiment illustrated in FIG. 4, RF coil 2 is a flat pancake-type RF coil, with RF susceptor 3 and sample holder 4 also being flat and situated parallel to the RF coil; however, one skilled in the art will readily understand that other configurations and other heating components may be used as appropriate to obtain a desired heating of the sample. RF susceptor 3 can be made from any suitable material, and can be a metal such as tungsten, molybdenum, niobium, steel, copper, etc., or can be a non-metal such as graphite.

Laser source 6, which provides the heat in the second annealing step, is situated outside the chamber and produces an unfocused laser beam 7 which travels into focusing optics 8, which in this embodiment are also located outside the chamber.

Laser source 6 can be any appropriate laser that can provide sufficient power to the sample to raise its temperature to $T_{max}$ which, as described above, is above a temperature $T_s$ at which the material is thermodynamically stable. In some embodiments, laser source 6 can be a gas laser such as a CO laser emitting at near 5 μm or can be a $CO_2$ laser emitting at a wavelength of 9-12 μm, and especially at 10.6 μm. In other embodiments, laser source 6 can be a diode laser, either fiber or free space coupled emitting in the IR, near-IR, visible, or UV ranges, e.g., emitting at 780-830 nm, 880 nm, 915-980 nm, 1060 nm, 1400-1500 nm, or other wavelengths. In still other embodiments, laser source 6 can be a solid state laser such as a Nd:YAG laser; a frequency-multiplexed (doubled, tripled, etc.) laser; a dye laser; or a pulsed laser such as an excimer, q-switched, or chirped laser.

Focusing optics 8 convert the unfocused beam 7 emitted by laser source 6 into a focused laser beam 10. Focusing optics 8 can be in the form of any suitable steerable focusing lens that can direct the laser beam onto specified locations on a stationary sample within the chamber; alternatively, it can be a stationary lens, with the sample being moved within the chamber so that the laser strikes the sample at different locations.

The focused laser beam 10 enters the chamber by means of window 9 in a wall of the chamber, where the window can be made from any suitable material such as diamond, sapphire, quartz, borosilicate glass, ZnSe, Ge, Si, N-BK7 optical glass, Schott glass, or other materials.

Once it is in the chamber, focused laser beam 10 strikes sample 5 and forms one or more laser heated zones 11 on the surface of the sample. By appropriately activating and steering steerable focusing optic 8 using any suitable steering mechanism, the focused laser beam can be directed to heat and anneal specified areas of the sample in a predetermined manner as described above.

The laser intensity profile at focus can be Gaussian in two dimensions (circular), Gaussian in two dimensions but with different FWHMs creating an oval appearing profile, flat (like a top hat) in one or both direction, or anywhere in between. In many cases, the profile can be Gaussian in the scanning direction with some narrow FWHM and either Gaussian or flat orthogonal to the scan direction.

The laser annealing in accordance with the present invention is accomplished across areas by rastering the beam (similar to ink jet printers) where the laser beam is scanned across the sample, then moves orthogonal to that scan direction by some distance, and scanned again. Adjacent scans can be stitched together to form a larger area that has been annealed; stitching of adjacent scans can be accomplished with a large amount of overlap (common with Gaussian orthogonal beam profiles) or little overlap (common with flat intensity profiles).

Figure 5:
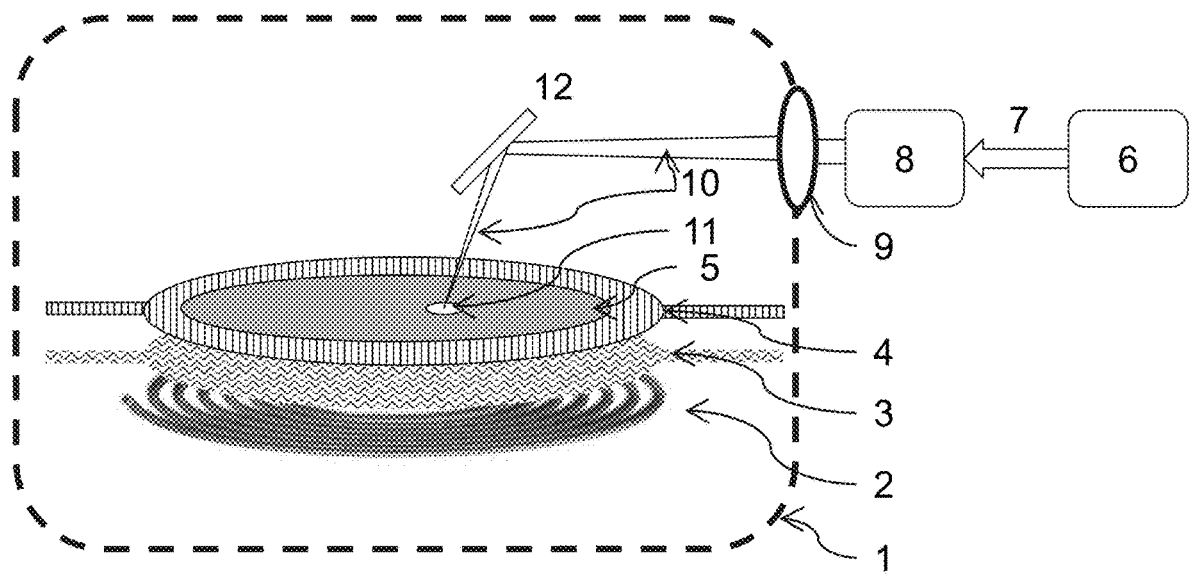
FIG. 5 is a block schematic illustrating aspects of another exemplary apparatus for use in activating implanted dopants in a III-nitride semiconductor material in accordance with the present invention.
Figure 6:
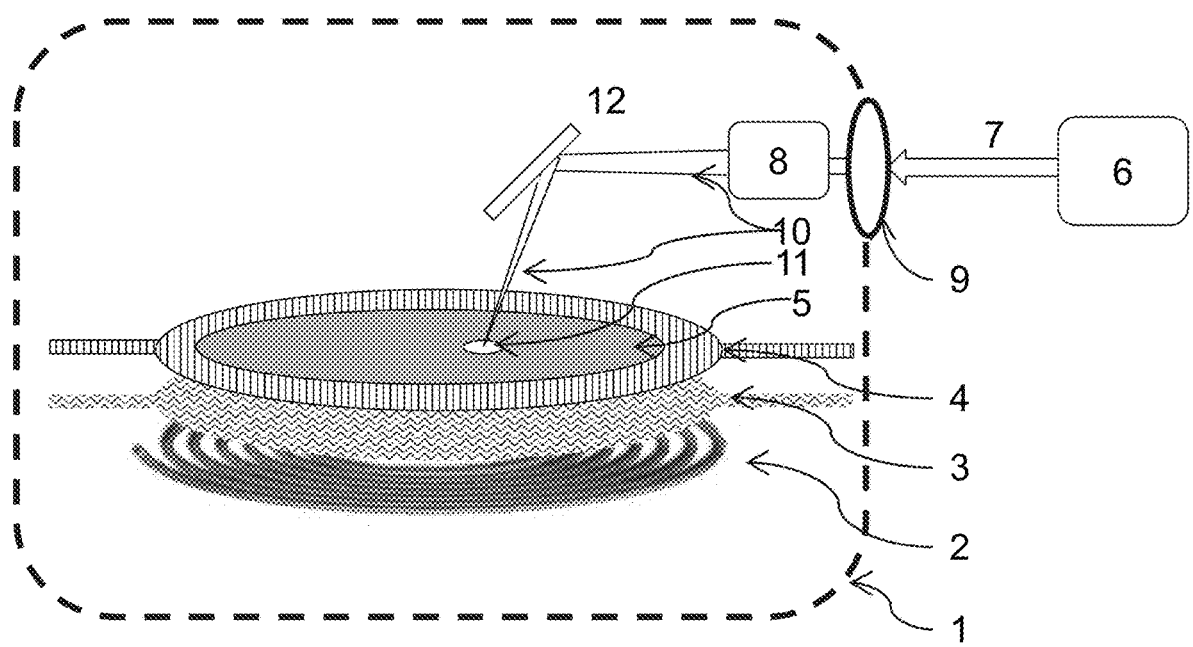
FIG. 6 is a block schematic illustrating aspects of another exemplary apparatus for use in activating implanted dopants in a III-nitride semiconductor material in accordance with the present invention.
Figure 7:
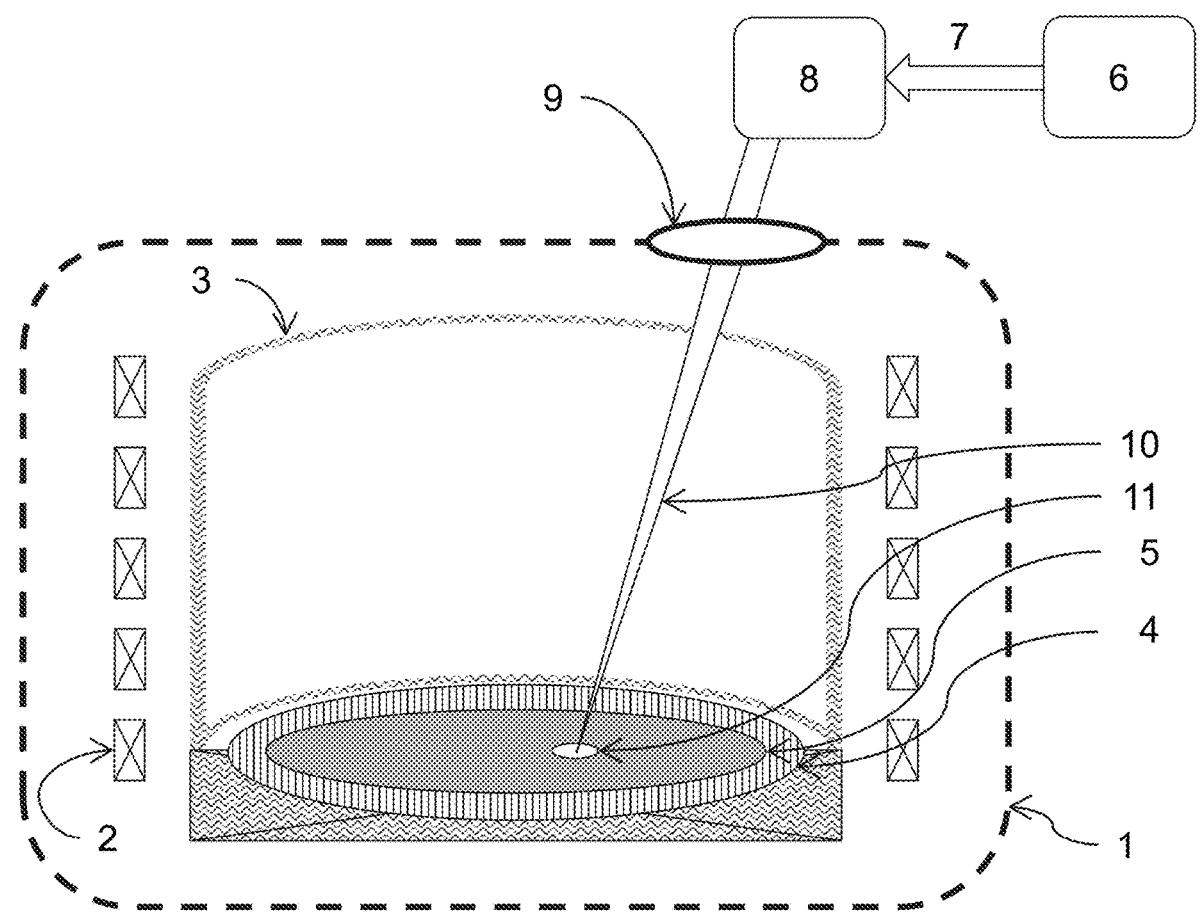
FIG. 7 is a block schematic illustrating aspects of another exemplary apparatus for use in activating implanted dopants in a III-nitride semiconductor material in accordance with the present invention.

In addition, the RF and laser heating of the sample in accordance with the present invention can be in any suitable geometrical orientation with respect to the chamber, with respect to each other, or with respect to the sample. For example, in the embodiment illustrated in FIG. 4, the laser is directed onto the sample from the top, while the RF heating is at the bottom, with the sample being parallel with respect to the horizon. However, as illustrated in FIGS. 5-7, other configurations are possible, such as ones in which the laser is directed onto the sample from the bottom or from the sides, with the samples being oriented horizontal or vertical with respect to the horizon. It is believed that in many cases, laser heating from below or from the side may reduce gas perturbations of the laser focus and yield a more uniform anneal, but any suitable configuration may be used as appropriate.

FIG. 5 illustrates an alternative embodiment of an apparatus that can be used to effect the enhanced SMRTA method using RF and laser annealing in accordance with the present invention. In the embodiment illustrated in FIG. 4, window 9 is in a "top-side" wall of the chamber, so that focused laser beam 10 directly strikes the upper surface of sample 5. In the embodiment illustrated in FIG. 5, the sample is oriented so that an edge of the sample rather than its face is in the direction of the laser source. Focused laser beam 10 enters the chamber 1 through window 9 and is directed onto the face of the sample by means of a controllable redirecting mirror 12. As with the steerable beam-focusing optics 8 in the "top-side" laser heating embodiment shown in FIG. 4, redirecting mirror 12 can be controllably used to direct the laser beam to heat the surface and form one or more laser heated zones 11 on one or more predetermined areas on the surface of sample 5 to selectively treat those areas in the manner described above.

As noted above, such "from the side" laser heating may be used to reduce perturbation of the laser focus from motion and/or turbulence of the gas in the chamber. All of the other components in this embodiment, i.e., RF coil 2, RF susceptor 3, sample holder 4, and sample 5 within the chamber, with laser source 6, unfocused laser beam 7, and steerable focusing optics 8 are as they were described above with respect to FIG. 4 but situated so as to direct the focused laser beam 10 through a "side-oriented" window 9.

Another embodiment in which the laser beam enters the chamber from the side is shown in FIG. 6. In this embodiment, all components are arranged as in FIG. 5, except that steerable focusing optics 8 are situated within the chamber 1 rather than outside of it, so that unfocused laser beam 7 enters the chamber through window 9 and is focused by focusing optics to form focused beam 10 within the chamber. Focused beam 10 is then controllably directed onto the surface of sample 5 by means of controllable laser redirecting mirror 12 to heat the surface and form one or more laser heated zones 11 on the surface of sample 5 to selectively treat those areas in the manner described above.

In the embodiments described above, the RF heating is provided by a flat pancake RF coil and RF susceptor situated, e.g., below the sample to be treated. In an alternative embodiment, RF heating element can be in the form of a flat pancake coil above the laser susceptor, with the laser impinging the sample from below.

Figure 8:
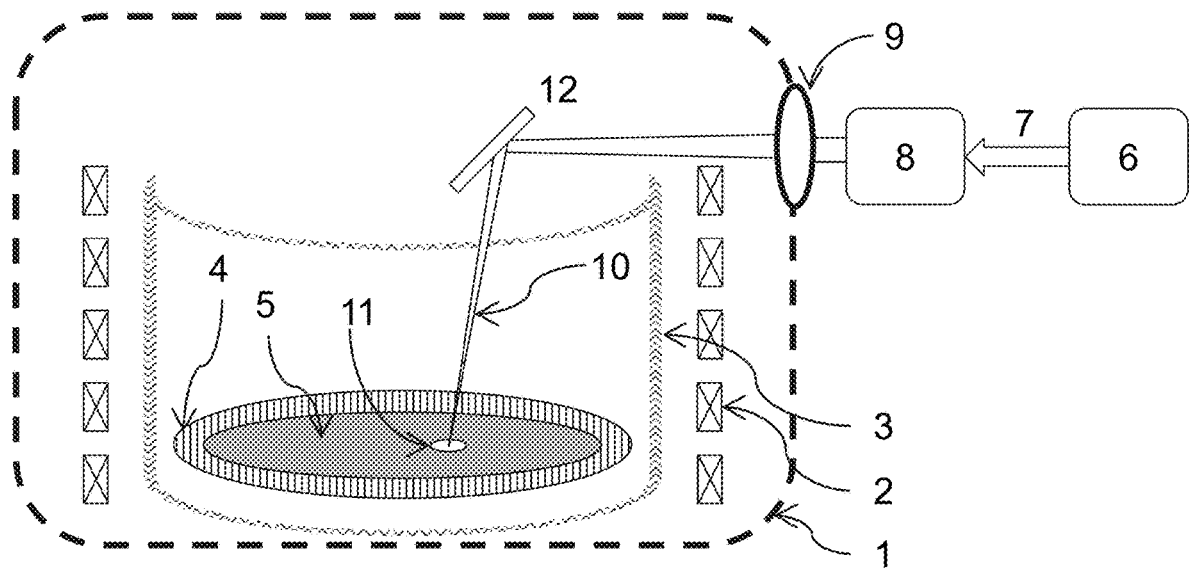
FIG. 8 is a block schematic illustrating aspects of another exemplary apparatus for use in activating implanted dopants in a III-nitride semiconductor material in accordance with the present invention.

In still other embodiments, aspects of which are illustrated in FIGS. 7 and 8, the RF heating source is a helical RF coil with a cylindrical RF susceptor surrounding the sample holder and the sample in the chamber.

Thus, as illustrated in FIG. 7, an exemplary embodiment of such an apparatus includes helical RF coil 2 and cylindrical RF susceptor 3 surrounding sample holder 4 which holds the sample 5 to be treated, all of which being housed within chamber 1. Laser source 6, which is outside of the chamber, produces unfocused laser beam 7 as described above, which travels to steerable focusing optics 8, all of which are situated "above" the chamber so that focusing optics produces a focused beam 10 which enters the chamber through window 9 in a top side of the chamber and strikes sample 5 to produce one or more laser heated zones 11 on the surface of the sample.

In the embodiment illustrated in FIG. 8, the RF heating components are the same as in the embodiment shown in FIG. 7, but the laser enters the chamber from the "side" as in the embodiment shown in FIG. 5. Thus, as shown in FIG. 8, the RF heating is provided by cylindrical RF heating coil 2 and RF susceptor 3 surrounding sample holder 4 and sample 5. Focused laser beam 10 produced by steerable laser optic 8 from unfocused laser beam 7 generated by laser source 6 enters through window 9 in the side of chamber 1, and then is controllably directed onto sample 5 by means of controllable laser redirecting mirror 12 to strike one or more predetermined areas and provide one or more laser heated zones 11 on the surface of the sample.

Advantages and New Features

The dual RF/laser annealing provided by the method of the present invention, provides the following advantages over prior art annealing techniques:

By decoupling baseline heating and pulsed heating regimes, better control and better precision of the annealing can be obtained.

Laser annealing specifically allows access to very high temperatures locally (2000-3000° C.) relatively easily depending on parameters, far in excess of bulk heating methods with the same complexity.

The increased heating and cooling rates enable the application of higher peak temperatures during shorter pulses.

The decreased pulse duration provided by the use of laser annealing allows the semiconductor material to tolerate higher temperatures due to the reduced time for damage or decomposition to occur, i.e. annealing a material while it is still metastable.

The access to higher temperatures also may break up deleterious defect complexes more efficiently.

A method and apparatus for an enhanced symmetric multicycle rapid thermal annealing of a semiconductor sample has been described. Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for removing defects and activating implanted dopant impurities in a wide bandgap semiconductor material, comprising:

placing a wide bandgap semiconductor material sample into an enclosure under a first applied gas pressure $P_1$;

in a first annealing step, heating the wide bandgap semiconductor material sample to a first predetermined steady temperature $T_1$ and holding the wide bandgap semiconductor material sample at $T_1$ for a first predetermined time $t_1$ to begin removing the defects and activating the implanted dopant impurities in the wide bandgap semiconductor material sample, $T_1$ being a temperature below a temperature $T_s$ above which the wide bandgap semiconductor material sample is thermodynamically unstable at pressure $P_1$;

after the expiration of time $t_1$, in a second annealing step, while maintaining the wide bandgap semiconductor material sample at a second predetermined temperature $T_2$ at a second applied gas pressure $P_2$, subjecting the sample to a plurality of laser irradiations having a predetermined power for one of a predetermined number of temperature pulses or a second predetermined time $t_2$, wherein each of the laser irradiations raises a temperature of an area of the wide bandgap semiconductor material sample impinged by the laser to a predetermined temperature $T_{max}$, higher than $T_s$, wherein at each laser irradiation, a temperature of the impinged area is above $T_s$ for a time $t_p$ shorter than a time $t_d$ at which the wide bandgap semiconductor material sample would start to decompose at temperatures between $T_s$ and $T_{max}$ to further remove the defects and activate the implanted dopant impurities in the wide bandgap semiconductor material sample; and at the end of the predetermined number of temperature pulses or the predetermined time $t_2$, maintaining the wide bandgap semiconductor material sample at a third predetermined steady temperature $T_3$ below a temperature $T_s$ for a third predetermined time $t_3$ to complete the removal of defects and activation of implanted dopant impurities in the wide bandgap semiconductor material sample.

2. The method according to claim 1, wherein the laser irradiations comprise a plurality of laser pulses.

3. The method according to claim 1, wherein the laser irradiations comprise a plurality of laser scans.

4. The method according to claim 1, wherein wide bandgap semiconductor material sample is a III-nitride material such as GaN, InN, AlN, BN, or an alloy thereof.

5. The method according to claim 1, wherein the wide bandgap semiconductor material sample is diamond.

6. The method according to claim 1, wherein the wide bandgap semiconductor material sample is SiC.

7. The method according to claim 1, wherein each of $T_1$, $T_2$, and $T_3$ is between 50° C. and a temperature at which the wide bandgap semiconductor material sample becomes thermodynamically unstable.

8. The method according to claim 1, wherein each of $t_1$, $t_2$, and $t_3$ is between one minute and one day.

9. The method according to claim 1, wherein $T_{max}$ is at least 0.7 times an absolute melting point of the wide bandgap semiconductor material sample.

10. The method according to claim 1, wherein the wide bandgap semiconductor material sample is heated to steady temperatures $T_1$, $T_2$, and $T_3$ by means of RF inductive heating.

11. The method according to claim 1, wherein the laser irradiation is provided by a $CO_2$ laser.

12. The method according to claim 1, wherein the laser irradiation is provided by an excimer laser.

13. The method according to claim 1, further comprising applying a first predetermined plurality of laser irradiations at a first power $P_{W1}$ to a first predetermined area $A_1$ of the wide bandgap semiconductor material sample and applying a second plurality of laser irradiations at a second power $P_{W2}$ to a second predetermined area $A_2$ of the wide bandgap semiconductor material sample to produce first and second areas in the wide bandgap semiconductor material sample having different degrees of defect removal and/or different implanted dopant activation.

14. An apparatus for removing defects and activating implanted dopant impurities in a wide bandgap semiconductor material sample, comprising:
a pressure chamber having a window in one wall thereof;
a sample holder configured to hold a wide bandgap semiconductor material sample in a predetermined orientation relative to the window in the chamber;
a laser source situated outside the chamber and being configured to apply a plurality of laser pulses or scans onto a surface of the wide bandgap semiconductor material sample;
steerable focusing optics configured to direct a beam from the laser source through the window so as to impinge on the wide bandgap semiconductor material sample as a focused laser beam on a predetermined area of the wide bandgap semiconductor material sample and scanning or rastering across a surface of the wide bandgap semiconductor material sample; and
a flat RF heating coil operatively connected to a voltage source and being situated adjacent a surface of the wide bandgap semiconductor material sample opposite the surface impinged by the laser.

15. The apparatus according to claim 14, wherein the wide bandgap semiconductor material sample is situated so that the window is situated above an upper surface of the wide bandgap semiconductor material sample, and wherein the laser beam travels through the window and directly strikes the upper surface of the wide bandgap semiconductor material sample.

16. The apparatus according to claim 14, wherein the steerable focusing optics are situated outside the pressure chamber.

17. The apparatus according to claim 14, wherein the steerable focusing optics are situated within the pressure chamber.

18. The apparatus according to claim 14, wherein the wide bandgap semiconductor material sample is situated so that the window is situated to a side of an upper surface of the wide bandgap semiconductor material sample, wherein the laser beam travels through the window towards the side of the upper surface of the wide bandgap semiconductor material sample, the apparatus further comprising a controllable redirecting mirror configured to direct the laser beam onto the upper surface of the wide bandgap semiconductor material sample.

19. The apparatus according to claim 14, further comprising a laser susceptor situated between the wide bandgap semiconductor material sample and the laser source, the laser susceptor being configured to cause the wide bandgap semiconductor material sample to be heated when the laser susceptor is subjected to light from the laser beam impinging on the laser susceptor surface.

20. An apparatus for removing defects and activating implanted dopant impurities in a wide bandgap semiconductor material sample, comprising:
a pressure chamber having a window in one wall thereof;
a sample holder configured to hold a wide bandgap semiconductor material sample in a predetermined orientation relative to the window in the chamber;
a helical RF heating coil surrounding the sample holder;
a laser source situated outside the chamber and being configured to apply a plurality of laser pulses or scans onto a surface of the wide bandgap semiconductor material sample; and
steerable focusing optics configured to direct a beam from the laser source through the window so as to impinge on the wide bandgap semiconductor material sample as a focused laser beam on a predetermined area of the wide bandgap semiconductor material sample and scanning or rastering across a surface of the wide bandgap semiconductor material sample.

21. The apparatus according to claim 20, wherein the wide bandgap semiconductor material sample is situated so that the window is situated above an upper surface of the wide bandgap semiconductor material sample, and wherein the laser beam travels through the window and directly strikes the upper surface of the wide bandgap semiconductor material sample.

22. The apparatus according to claim 20, wherein the steerable focusing optics are situated outside the pressure chamber.

23. The apparatus according to claim 20, wherein the steerable focusing optics are situated within the pressure chamber.

24. The apparatus according to claim 20, wherein the wide bandgap semiconductor material sample is situated so that the window is situated to a side of an upper surface of the wide bandgap semiconductor material sample, wherein the laser beam travels through the window towards the side of the upper surface of the wide bandgap semiconductor material sample, the apparatus further comprising a controllable redirecting mirror configured to direct the laser beam onto the upper surface of the wide bandgap semiconductor material sample.

25. The apparatus according to claim 20, further comprising a laser susceptor situated between the wide bandgap semiconductor material sample and the laser source, the laser susceptor being configured to cause the wide bandgap semiconductor material sample to be heated when the laser susceptor is subjected to light from the laser beam impinging on the laser susceptor surface.

* * * * *